(12) United States Patent  
Takahashi

(10) Patent No.: US 7,041,602 B2
(45) Date of Patent: May 9, 2006

(54) METHOD OF FABRICATING SEMICONDUCTOR DEVICE

(75) Inventor: Akira Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 251 days.

(21) Appl. No.: 10/619,592

(22) Filed: Jul. 16, 2003

(65) Prior Publication Data

US 2004/0152327 A1 Aug. 5, 2004

(30) Foreign Application Priority Data

Jan. 31, 2003 (JP) ............................. 2003-023452

(51) Int. Cl.
*H01L 21/311* (2006.01)
*H01L 21/302* (2006.01)
*H01L 21/461* (2006.01)

(52) U.S. Cl. .................... 438/700; 438/714; 438/717; 438/723; 438/724; 438/725

(58) Field of Classification Search ................ 438/700, 438/706, 714, 717, 723–725
See application file for complete search history.

(56) References Cited

U.S. PATENT DOCUMENTS 5,665,203 A * 9/1997 Lee et al. .................... 438/585
5,913,148 A 6/1999 Hills
6,008,121 A * 12/1999 Yang et al. .................. 438/637
6,025,273 A * 2/2000 Chen et al. .................. 438/706
6,696,365 B1 * 2/2004 Kumar et al. ............... 438/706
6,706,638 B1 * 3/2004 Yang et al. .................. 438/706
6,750,086 B1 * 6/2004 Jinno et al. ................. 438/151

FOREIGN PATENT DOCUMENTS

| JP | 3-104216 | 5/1991 |
|---|---|---|
| JP | 4-196315 | 7/1992 |
| JP | 5-29479 | 2/1993 |
| JP | 05-226278 | 9/1993 |
| JP | 05-251407 | 9/1993 |
| JP | 8-148567 | 6/1996 |
| JP | 08255905 A | 10/1996 |
| JP | 10-56021 | 2/1998 |

* cited by examiner

Primary Examiner—Duy-Vu N. Deo
(74) Attorney, Agent, or Firm—Volentine Francos & Whitt, PLLC

(57) ABSTRACT

A method of fabricating a semiconductor device includes forming an interlayer insulating film on a semiconductor element; forming a polysilicon layer on the interlayer insulating film; implanting dopant atoms into the polysilicon layer; forming a resist layer on the polysilicon layer; forming one or more first openings in the resist layer; etching the polysilicon layer using the resist layer as a first mask, thereby forming one or more second openings in the polysilicon layer; and forming one or more contact holes in the interlayer insulating film using at least the polysilicon layer as a second mask.

22 Claims, 5 Drawing Sheets

METHOD OF FABRICATING SEMICONDUCTOR DEVICE

BACKGROUND OF THE INVENTION

The present invention relates to a method of fabricating a semiconductor device, particularly, a method of forming one or more contact holes in an interlayer insulating film of a semiconductor device.

A semiconductor device requires smaller design rule in order to have higher operational speed and lower electrical consumption. Therefore, it is required that a contact hole in an interlayer insulating film of a semiconductor device should have a smaller diameter. For example, a contact hole in an interlayer insulating film of a semiconductor device of 100 nm node generation needs to have a diameter of approximately 0.16 µm as the smallest contact hole size.

In general, a contact hole is formed by the steps of forming a resist layer on an interlayer insulating film, forming an opening in the resist layer using photolithography, and etching the interlayer insulating film using the resist layer as a mask. However, an expensive apparatus must be used for forming a mask based on the smallest design rule in order to reduce a diameter of a contact hole, thereby increasing the manufacturing cost of a semiconductor device. For example, Japanese Patent Kokai (Laying-open) Publication No. 05-226278, especially, its FIG. 3, discloses a side wall disposed inside an opening passing through a resist layer and an interlayer insulating film for reducing a diameter of a contact hole.

The side walls make it possible to reduce diameters of plural openings passing through a resist layer and an interlayer insulating film by the same value. Therefore, a process using the side walls is suitable for forming plural contact holes with the same diameter simultaneously, but is not suitable for forming plural contact holes with different diameters simultaneously. Furthermore, when forming plural contact holes with different diameters simultaneously using the side walls, diameters of plural openings passing through a resist layer must have different values. However, there is a problem that dimensional error tends to be increased in the openings with a diameter different from a diameter of a target opening in an exposure process of the resist layer.

SUMMARY OF THE INVENTION

It is an object of the present invention to provide a method of fabricating a semiconductor device that makes it possible to adjust a diameter of a contact hole with a high degree of precision so that the contact hole has a different diameter from a mask opening.

It is another object of the present invention to provide a method of fabricating a semiconductor device that makes it possible to form more than one contact holes with different diameters in the same layer on a semiconductor element by the same etching process.

According to the present invention, a method of fabricating a semiconductor device includes: forming a first layer on a semiconductor element; forming a second layer on the first layer, the second layer being made of a materiel, an etching rate of which changes in accordance with kind and concentration of dopant atoms implanted therein; implanting dopant atoms into the second layer; forming a third layer on the second layer; forming one or more first openings in the third layer; etching the second layer using the third layer as a first mask, thereby forming one or more second openings in the second layer; and forming one or more contact holes in the first layer using at least the second layer as a second mask.

BRIEF DESCRIPTION OF DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

FIGS. 1A to 1E are cross sectional views schematically showing processes in a method of fabricating a semiconductor device in accordance with a first embodiment of the present invention respectively. The method of the first embodiment will be described with reference to FIGS. 1A to 1E.

Figure 1A:
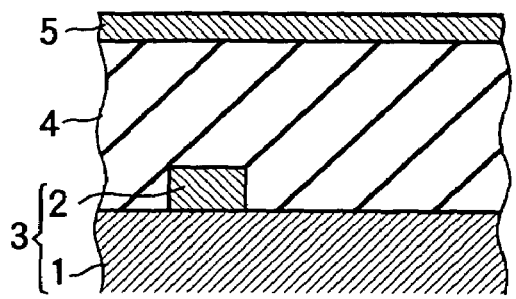
FIGS. 1A to 1E are cross sectional views schematically showing processes in a method of fabricating a semiconductor device in accordance with a first embodiment of the present invention respectively.

First, as shown in FIG. 1A, an interlayer insulating (or dielectric) film 4 and a polysilicon layer 5 are formed in this order on a semiconductor element 3 using, for example, chemical vapor deposition (CVD) or the like. The semiconductor element 3 is composed of, for example, a silicon substrate 1, a gate 2, and active areas such as a source and a drain. Further, the configuration of the semiconductor element 3 is not limited to that illustrated in the figures. Furthermore, the interlayer insulating film 4 is formed of, for example, silicon oxide, silicon nitride, or the like. Moreover, the polysilicon layer 5 has the property of changing its etching rate in accordance with kind (that is, implant species) and concentration (that is, implant density) of dopant atoms (that is, impurities) implanted therein.

Figure 1B:
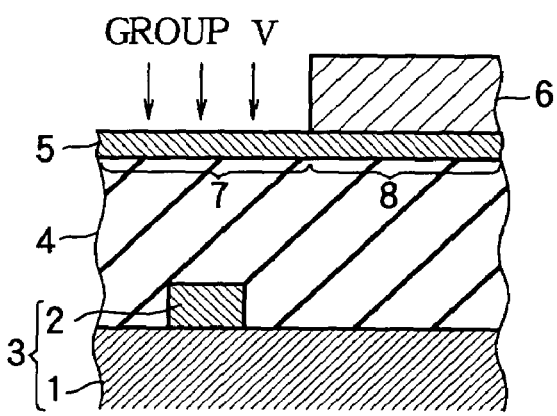

Next, as shown in FIG. 1B, the first resist layer 6 is coated on the polysilicon layer 5 and patterned using photolithography so that the polysilicon layer 5 inside a specific area 7 covering a gate 2 (that is, the polysilicon layer 5 disposed inside a specific area 7) is exposed and the first resist layer 6 in an area 8 other than the specific area 7 (that is, the first resist layer 6 disposed outside the specific area 7) is left. Next, the polysilicon layer 5 inside the specific area 7 is doped by implanting group V atoms (dopant atoms) such as As (arsenic) or P (phosphorus) into the specific area 7. Next, the first resist layer 6 is removed, and the polysilicon layer 5 is annealed at about 1000 degrees centigrade in order to activate the dopant atoms implanted into the polysilicon layer 5. Further, the process of doping the specific area 7 of the polysilicon layer 5 with group V atoms may be replaced by another process of doping the area 8 other than the specific area 7 of the polysilicon layer 5 with group III atoms.

Figure 1C:
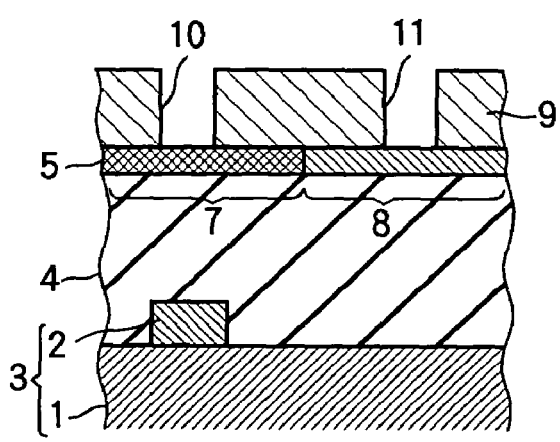

Next, as shown in FIG. 1C, the second resist layer 9 is coated on the polysilicon layer 5, and the second resist layer 9 is patterned using photolithography so that an opening 10 is formed in the specific area 7 of the second resist layer 9 and an opening 11 is formed in the area 8 other than the specific area 7 of the second resist layer 9. In the first embodiment, the openings 10 and 11 are formed so as to have the same diameter. This means that even when the openings 10 and 11 have the same diameter, openings 12 and 13 with different diameters can be formed in the polysilicon layer 5, and therefore contact holes (14 and 15 in FIG. 1E) with different diameters (or different sizes) can be formed. Further, the openings 10 and 11 may be formed so as to have different diameters. The shapes and ranges of the areas 7 and 8 and the numbers and positions of the openings 10 and 11 can be decided based on various conditions such as the shape of the circuit formed in the silicon substrate 1 and the number and position of the contact holes to be formed in the interlayer insulating film 4.

Figure 1D:
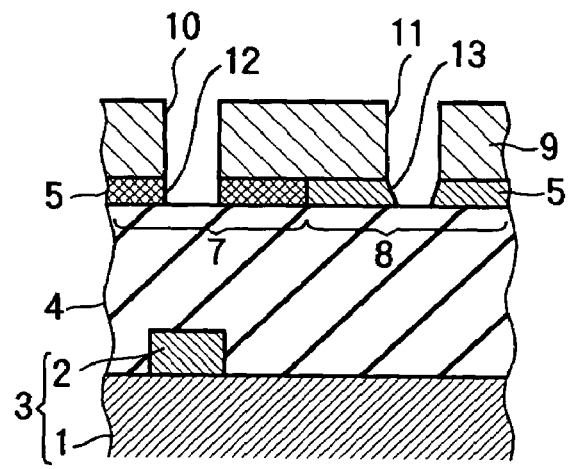

Next, as shown in FIG. 1D, the polysilicon layer 5 is etched using the second resist layer 9 as a mask. Etching gas used in this etching process is, for example, a mixture gas of HBr and $O_2$, a mixture gas of $O_2$, HBr and He, or the like. The etching gas can include $Cl_2$ or $CF_4$ in addition to $O_2$, HBr or He. Polysilicon has the property that an etching rate increases by implanting group V atoms and decreases by implanting group III atoms. Therefore, as shown in FIG. 1D, when forming the openings 12 and 13 in the polysilicon layer 5 by the same etching process, a diameter of the opening 13 of the polysilicon layer 5 formed directly below the opening 11 of the second resist layer 9 can be made smaller than a diameter of the opening 12 of the polysilicon layer 5 formed directly below the opening 10 of the second resist layer 9. The opening 13 is illustrated in FIG. 1D as a truncated cone with a small diameter on a lower side, that is, on a side of the interlayer insulating film 4. Further, the opening 12 is illustrated in FIG. 1D as a pillar with a constant diameter.

For example, if the forming time (that is, the elapsed time until etching endpoint detection) of the opening 12 formed in the polysilicon layer 5 inside the specific area 7 is shortened by changing kind and concentration of dopant atoms, a diameter of the opening 13 to be formed in the polysilicon layer 5 inside the area 8 other than the specific area 7 can be reduced. In contrast with this, if the forming time (that is, the elapsed time until etching endpoint detection) of the opening 12 formed in the polysilicon layer 5 inside the specific area 7 is lengthened by changing kind and concentration of dopant atoms, a diameter of the opening 13 to be formed in the polysilicon layer 5 inside the area 8 other than the specific area 7 can be increased.

Figure 1E:
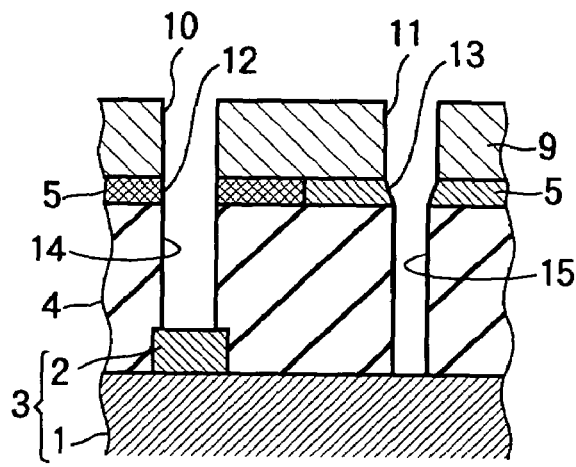

Next, the interlayer insulating film 4 is etched using the polysilicon layer 5 and second resist layer 9 as a mask so that, as shown in FIG. 1E, the large-diameter contact hole 14 is formed directly below the opening 12 of the polysilicon layer 5 in the specific area 7 and the small-diameter contact hole 15 is formed directly below the opening 13 of the polysilicon layer 5 in the area 8 other than the specific area 7. Further, by removing the second resist layer 9, a mask to be used in the etching process may be only the polysilicon layer 5. Furthermore, the large-diameter contact hole 14 is formed directly above the gate 2, for example. Moreover, the small-diameter contact hole 15 is formed directly above an active area such as a source or a drain, for example. After that, a metal wiring layer (not shown) is formed on an area including inside of the contact holes 14 and 15.

As described above, in the method of the first embodiment, since the openings 12 and 13 with different diameters are formed in the polysilicon layer 5 by adjusting kind and concentration of dopant atoms implanted into the polysilicon layer 5, a diameter of the contact holes 14 and 15 can be adjusted with a high degree of precision. Furthermore, in the method of the first embodiment, more than one contact holes with different diameters can be formed in the same layer on a semiconductor element by the same etching process.

In addition, there is an advantage of remarkably reducing the source/drain area that is most effective for reduction of chip area when the large-diameter contact hole 14 is formed on the gate 2 and the small-diameter contact holes 15 are formed on the source and the drain respectively. Furthermore, there is an advantage of reducing a resistance value that increases in proportion to reduction of the square of a diameter of an electrode inside the contact hole, that is, reduction of a cross-sectional area of an electrode inside the contact hole.

Next, it will be described how the kind and concentration of dopant atoms implanted into a polysilicon layer influence an etching rate of a polysilicon layer. TABLE 1 indicates a measurement result of etching rates when dopant atoms are implanted into a polysilicon layer.

TABLE 1

| KIND AND CONCENTRATION OF DOPANT ATOMS ($cm^{-2}$) | | ENDPOINT DETECTION TIME (sec) |
|---|---|---|
| $P^+$ (PHOSPHORUS) | 5.0E15 | 35 |
| NO DOPANT | | 45 |
| $B^+$ (BORON) | 5.0E15 | 55 |

As shown in TABLE 1, it takes 35 sec until the etching endpoint detection of the polysilicon layer when it is doped with $P^+$ (phosphorus) of $5.0 \times 10^{15}$ $cm^{-2}$ (expressed by "5.0E15" in TABLE 1), it takes 45 sec until the etching endpoint detection of the polysilicon layer when it is not doped (expressed by "NO DOPANT" in TABLE 1), and it takes 55 sec until the etching endpoint detection of the polysilicon layer when it is doped with $B^+$ (boron) of $5.0 \times 10^{15}$ $cm^{-2}$ (expressed by "5.0E15" in TABLE 1). TABLE 1 proves the property that an etching rate of a polysilicon layer increases when group V atoms such as P (phosphorus) are implanted therein and decreases when group III atoms such as B (boron) are implanted therein.

Furthermore, how the kind and concentration of dopant atoms implanted into a polysilicon layer influence an etching rate of a polysilicon layer can be described with reference to data measured in dual gate process of a CMOS device. This is because the dual gate process of a CMOS device and the present invention include a common manufacturing process. In dual gate process, group V atom such as As (arsenic) or P (phosphorus) is implanted into an N channel area, group III atoms such as B (boron) is implanted into a P channel area, and then gates are formed in an N channel area and a P channel area of the polysilicon layer simultaneously. TABLE 2 indicates a measurement result of gate structures formed by dual gate process. In a main step of dual gate process, etching conditions are HBr flow of 100 sccm (Standard Cubic Centimeters per Minute), $O_2$ flow of 3 sccm, an upper electrode applied electric power of 250 W in an etching device, a lower part electrode applied electric power of 30 W in the etching device, an atmospheric pressure of 8 mTorr in the etching device and a temperature of 60 degrees centigrade in the etching device, and etching is finished by etching endpoint detection. In addition, in an overetching step of dual gate process, etching conditions are $O_2$ flow of 2 sccm, HBr flow of 100 sccm, He flow of 100 sccm, an upper electrode applied electric power of 250 W in the etching device, a lower electrode applied electric power of 50 W in the etching device, an atmospheric pressure of 60 mTorr in the etching device, a temperature of 60 degrees centigrade in the etching device, and an etching time of 60 sec.

Second Embodiment

FIGS. 5A to 5F are cross sectional views schematically showing processes in a method of fabricating a semiconductor device in accordance with a second embodiment of the present invention respectively. Those structures in FIGS. 5A to 5F that are identical to or correspond to structures in FIGS. 1A to 1E are assigned identical symbols. The method of the second embodiment will be described with reference to FIGS. 5A to 5F.

Figure 5A:
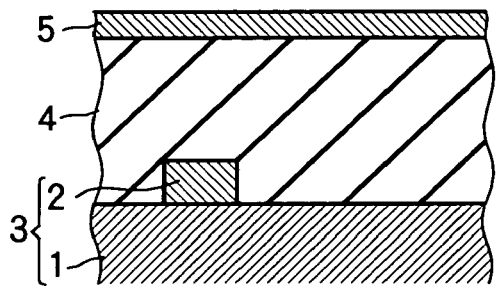
FIGS. 5A to 5F are cross sectional views schematically showing processes in a method of fabricating a semiconductor device in accordance with a second embodiment of the present invention respectively.

First, as shown in FIG. 5A, an interlayer insulating film 4 and a polysilicon layer 5 are formed in this order on a semiconductor element 3 including a silicon substrate 1 and a gate 2 using CVD or the like.

Figure 5D:
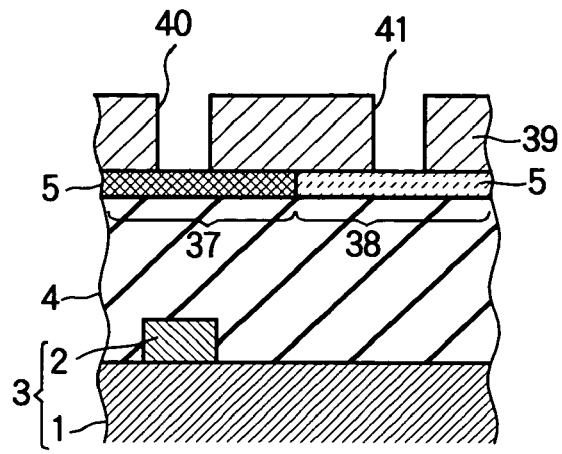
Figure 5B:
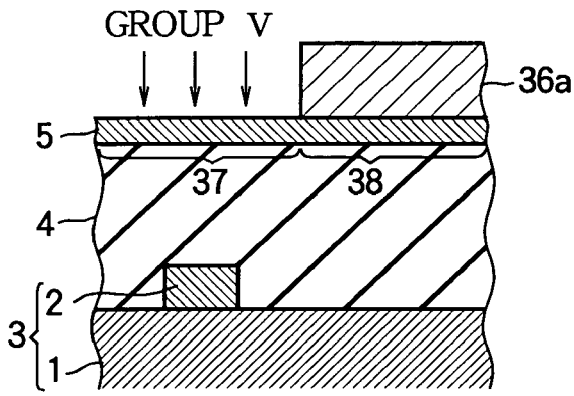

Next, as shown in FIG. 5B, the first resist layer 36a is coated on the polysilicon layer 5 and patterned using photolithography so that the polysilicon layer 5 inside a specific area 37 covering a gate 2 (that is, the polysilicon layer 5 disposed inside the specific area 37) is exposed and the first resist layer 36a in an area 38 other than the specific area 37 (that is, the first resist layer 36a disposed outside the specific area 37) is left. Next, the polysilicon layer 5 inside the specific area 37 is doped by implanting group V atoms (dopant atoms) such as As (arsenic) or P (phosphorus) into the specific area 37. Next, the first resist layer 36a is removed.

Figure 5E:
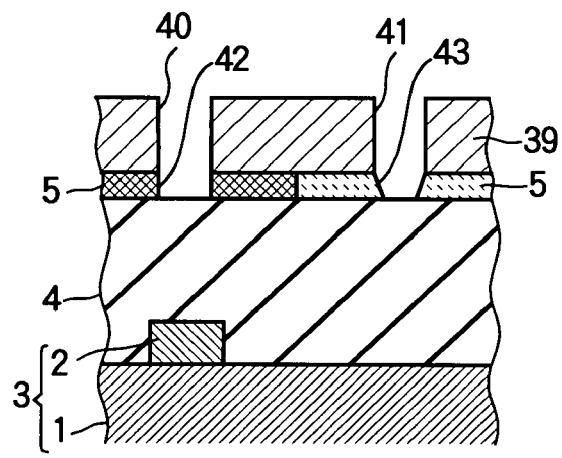
Figure 5C:
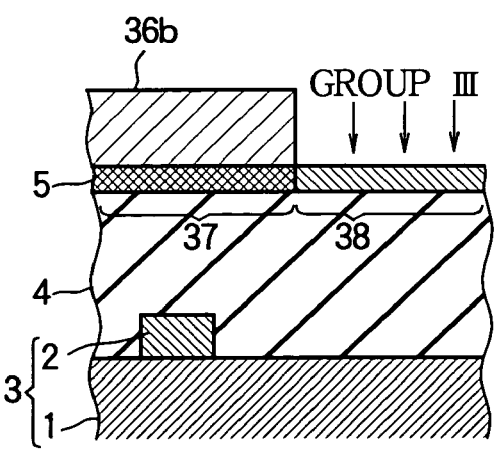

Next, as shown in FIG. 5C, the second resist layer 36b is coated on the polysilicon layer 5 and patterned using photolithography so that the polysilicon layer 5 inside the area

TABLE 2

| N CHANNEL AREA | | P CHANNEL AREA | | DIFFERENCES | |
|---|---|---|---|---|---|
| | | | | DOPANT | GATE |
| DOPANT CONCENTRATION DN ($cm^{-2}$) | GATE SIZE LN (μm) | DOPANT CONCENTRATION DP ($cm^{-2}$) | GATE SIZE LP (μm) | CONCENTRATION DIFFERENCES DN − (−DP) ($cm^{-2}$) | SIZE DIFFERENCES LP − LN (μm) |
| 5E15 | 0.130 | 5E15 | 0.167 | 10E15 | 0.037 |
| 5E15 | 0.130 | 2E15 | 0.161 | 7E15 | 0.031 |
| 5E15 | 0.130 | NO DOPANT | 0.156 | 5E15 | 0.026 |
| 2E15 | 0.130 | NO DOPANT | 0.141 | 2E15 | 0.011 |
| NO DOPANT | 0.130 | NO DOPANT | 0.132 | 0 | 0.002 |

Figure 2:
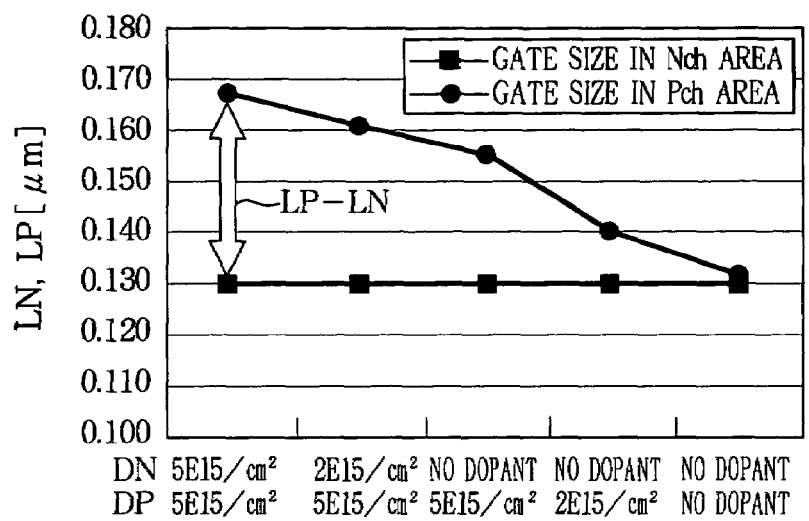
FIG. 2 shows graphs of gate sizes versus dopant concentrations in a polysilicon layer when gates are formed in an N channel area and a P channel area using dual gate process.
Figure 3:
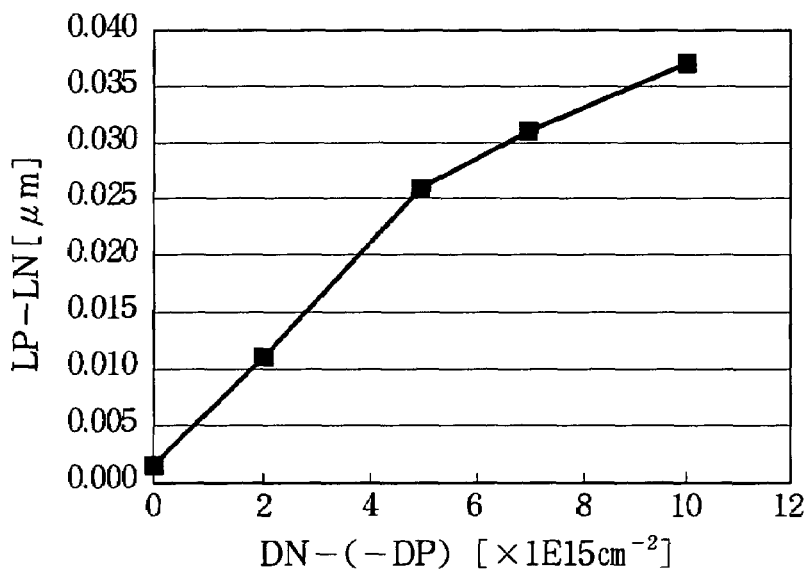
FIG. 3 shows a graph of gate size differences versus dopant concentration differences when gates are formed in an N channel area and a P channel area using dual gate process.

FIG. 2 shows a graph of N channel area gate size LN μm versus N channel area dopant concentration DN $cm^{-2}$ and a graph of P channel area gate size LP μm versus P channel area dopant concentration DP $cm^{-2}$ in a polysilicon layer when the gates (shown in FIG. 4) are formed in an N channel area and a P channel area using dual gate process. Further, FIG. 3 shows a graph of gate size differences LP-LN μm versus dopant concentration differences DN-(-DP) $cm^{-2}$ when the gates are formed in an N channel area and a P channel area using dual gate process. Furthermore, FIG. 4 is a cross sectional view schematically showing gates 21 and 22 when the gates are formed in an N channel area and a P channel area using dual gate process.

Figure 4:
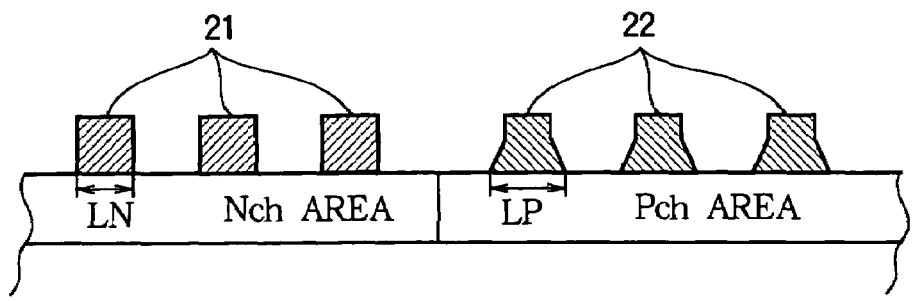
FIG. 4 is a cross sectional view schematically showing gates when those are formed in an N channel area and a P channel area using dual gate process.

It is apparent from TABLE 2 and FIGS. 2 to 4 that an etching rate of a polysilicon layer changes in accordance with kind and concentration of dopant atoms implanted into the polysilicon layer. It is also apparent from TABLE 2 and FIGS. 2 to 4 that an etching rate decreases when group V atoms such as P (phosphorus) are implanted and increases when group III atoms such as B (boron) are implanted.

38 (that is, the polysilicon layer 5 disposed outside the specific area 37) is exposed and the second resist layer 36b inside the specific area 37 (that is, the second resist layer 36b disposed inside the specific area 37) is left. Next, the polysilicon layer 5 inside the area 38 is doped by implanting group III atoms (dopant atoms) such as B (boron) into the area 38. Next, the second resist layer 36b is removed, and the polysilicon layer 5 is annealed at about 1000 degrees centigrade in order to activate the dopant atoms implanted into the polysilicon layer 5.

Next, as shown in FIG. 5D, the third resist layer 39 is coated on the polysilicon layer 5 and patterned using photolithography so that openings 40 and 41 are formed in the specific area 37 and the area 38 other than the specific area 37 respectively. In the second embodiment, the openings 40 and 41 are formed so as to have the same diameter. This means that even when the opening 40 and 41 have the same diameter, openings 42 and 43 with different diameters can be formed in the polysilicon layer 5, and therefore contact holes (44 and 45 in FIG. 5F) with different diameters can be formed. Further, the openings 40 and 41 may be formed so as to have the different diameters. The shapes and ranges of the areas 37 and 38 and the numbers and positions of the openings 40 and 41 can be decided based on various conditions such as the shape of the circuit formed in the silicon substrate 1 and the number and position of the contact holes to be formed in the interlayer insulating film 4.

Figure 5F:
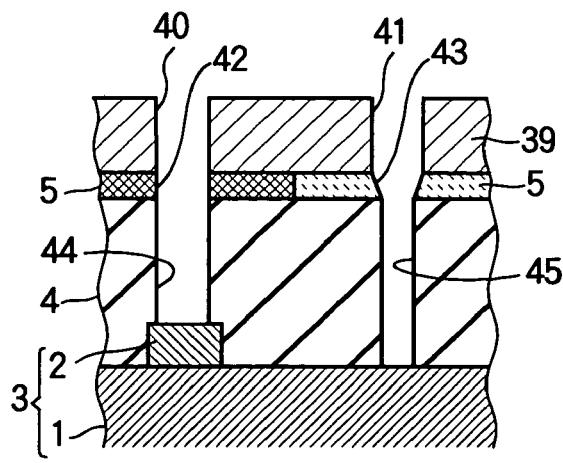

Next, as shown in FIG. 5E, the polysilicon layer 5 is etched using the third resist layer 39 as a mask. Etching gas and other conditions used in this etching process are the same as those in the first embodiment. Polysilicon has the property that an etching rate increases by implanting the group V atoms and decreases by implanting the group III atoms. Therefore, as shown in FIG. 5E, when forming the openings 42 and 43 in the polysilicon layer 5 by the same etching process, a diameter of the opening 43 of the polysilicon layer 5 formed directly below the opening 41 of the third resist layer 39 can be made smaller than a diameter of the opening 42 of the polysilicon layer 5 formed directly below the opening 40 of the third resist layer 39. The opening 43 is illustrated in FIG. 5F as a truncated cone with a small diameter on a lower side, that is, on a side of the interlayer insulating film 4. Further, the opening 42 is illustrated in FIG. 5F as a pillar with a constant diameter.

For example, if the forming time (that is, the elapsed time until etching endpoint detection) of the opening 42 formed in the polysilicon layer 5 inside the specific area 37 is shortened by changing kind and concentration of dopant atoms, a diameter of the opening 43 to be formed in the polysilicon layer 5 inside the area 38 other than the specific area 37 can be reduced. In contrast with this, if the forming time (that is, the elapsed time until etching endpoint detection) of the opening 42 formed in the polysilicon layer 5 inside the specific area 37 is lengthened by changing kind and concentration of dopant atoms, a diameter of the opening 43 to be formed in the polysilicon layer 5 inside the area 38 other than the specific area 37 can be increased.

Next, the interlayer insulating film 4 is etched using the polysilicon layer 5 and third resist layer 39 as a mask so that, as shown in FIG. 5F, the large-diameter contact hole 44 is formed directly below the opening 42 of the polysilicon layer 5 in the specific area 37 and the small-diameter contact hole 45 is formed directly below the opening 43 of the polysilicon layer 5 in the area 38 other than the specific area 37. Further, by removing the third resist layer 39, a mask to be used in the etching process may be only the polysilicon layer 5. Furthermore, the large-diameter contact hole 44 is formed directly above the gate 2, for example. Moreover, the small-diameter contact hole 45 is formed directly above an active area such as a source or a drain, for example. After that, a metal wiring layer (not shown) is formed on an area including inside of the contact holes 44 and 45.

As described above, in the method of the second embodiment, since the openings 42 and 43 with different diameters are formed in the polysilicon layer 5 by adjusting kind and concentration of dopant atoms implanted into the polysilicon layer 5, a diameter of the contact holes 44 and 45 can be adjusted with a high degree of precision. Furthermore, in the method of the second embodiment, more than one contact holes with different diameters can be formed in the same layer on a semiconductor element by the same etching process.

Further, in the second embodiment, since dopant concentration difference between the areas 37 and 38 can be larger, it is possible to increase a difference between diameters of the contact holes.

Furthermore, if dopant concentration in either the area 37 or 38 is increased to an order of $10^{16}$ to $10^{17}$ cm$^{-2}$, there is a risk of not forming an opening due to occurrence of a side etch in the N channel area and excessive taper in a P channel area. In the second embodiment, since group V atoms and group III atoms are implanted into the different areas of the polysilicon layer 5, even when dopant concentration is low, it is possible to increase a difference between diameters of the contact holes.

Furthermore, in the second embodiment, if another area (not shown in the figures) without dopant atoms is provided in addition to the areas 37 and 38, another contact hole with a diameter different from those of the contact holes 44 and 45 formed in the areas 37 and 38 can be formed in the interlayer insulating layer 4.

Moreover, in the second embodiment, if there are more than two areas where concentrations of the dopant atoms are different, more than two contact hole diameters can be realized.

Third Embodiment

FIGS. 6A to 6E are cross sectional views schematically showing processes in a method of fabricating a semiconductor device in accordance with a third embodiment of the present invention respectively. Those structures in FIGS. 6A to 6E that are identical to or correspond to structures in FIGS. 1A to 1E are assigned identical symbols. The method of the third embodiment will be described with reference to FIGS. 6A to 6E.

Figure 6A:
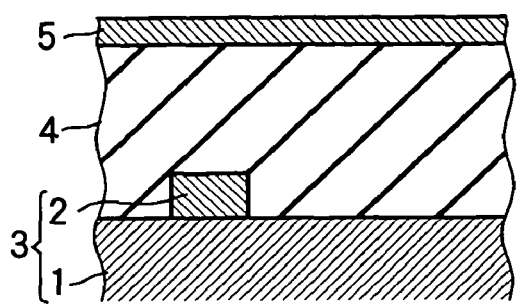
FIGS. 6A to 6E are cross sectional views schematically showing processes in a method of fabricating a semiconductor device in accordance with a third embodiment of the present invention respectively.

First, as shown in FIG. 6A, an interlayer insulating film 4 and a polysilicon layer 5 are formed in this order on a semiconductor element 3 including a silicon substrate 1 and a gate 2 using CVD or the like.

Figure 6B:
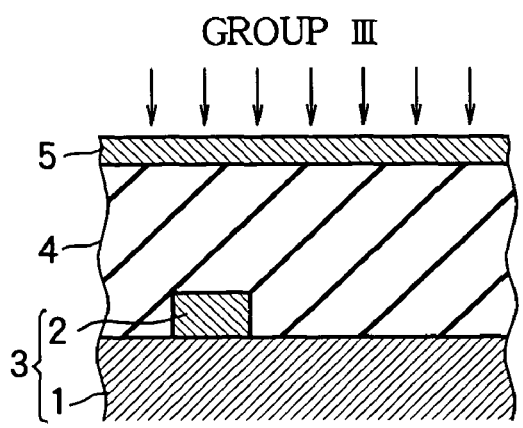

Next, as shown in FIG. 6B, the whole area of the polysilicon layer 5 is doped by implanting group III atoms such as B (boron). After that, the polysilicon layer 5 is annealed at about 1000 degrees centigrade in order to activate the dopant atoms implanted therein.

Figure 6C:
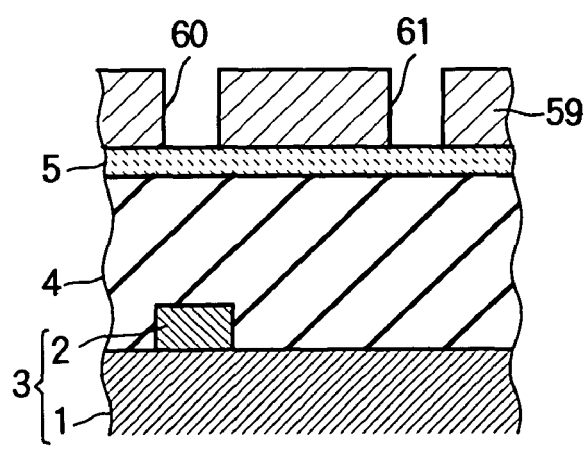

Next, as shown in FIG. 6C, the resist layer 59 is coated on the polysilicon layer 5 and patterned using photolithography so that openings 60 and 61 are formed in the polysilicon layer 5. The numbers and positions of the openings 60 and 61 can be decided based on various conditions such as the shape of the circuit formed in the silicon substrate 1 and the number and position of the contact holes to be formed in the interlayer insulating film 4.

Figure 6D:
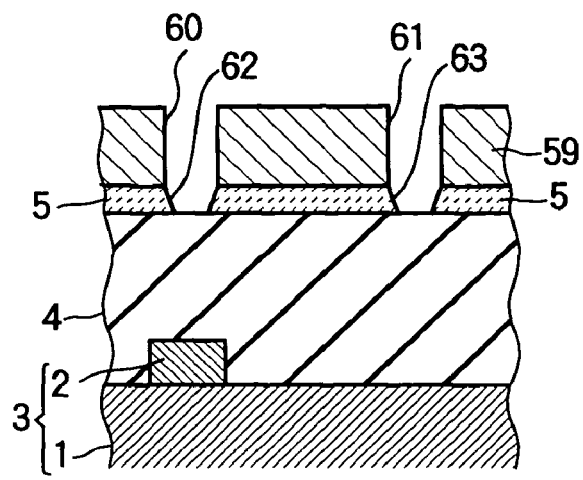

Next, as shown in FIG. 6D, the polysilicon layer 5 is etched using the resist layer 59 as a mask. Etching gas and other conditions used in this etching process are the same as those in the first embodiment. Polysilicon has the property that an etching rate decreases by implanting the group III atoms. As shown in FIG. 6D, when forming the openings 62 and 63 in the polysilicon layer 5 by the etching process, a diameter of the openings 62 and 63 of the polysilicon layer 5 formed directly below the openings 60 and 61 of the resist layer 59 can be made smaller than a diameter of the openings 62 and 63. The openings 62 and 63 are illustrated in FIG. 6D as a truncated cone with a small diameter on a lower side, that is, on a side of the interlayer insulating film 4. Further, diameters of the openings 62 and 63 can be changed continuously by adjusting kind and concentration of dopant atoms implanted into the polysilicon layer 5.

Figure 6E:
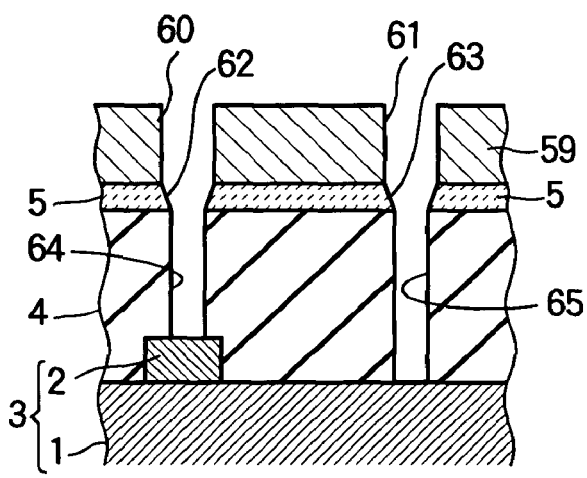

Next, the interlayer insulating film 4 is etched using the polysilicon layer 5 and resist layer 59 as a mask so that, as shown in FIG. 6E, the contact holes 64 and 65 are formed in the interlayer insulating film 4. The contact hole 64 is positioned on the gate 2. The contact hole 65 is positioned on the active area such as the drain and the source. After that, metal wiring layers (not shown) are formed on an area including inside of the contact holes 64 and 65.

As described above, in the method of the third embodiment, diameters of contact holes 64 and 65, which are different from diameters of the openings 60 and 61, can be adjusted with a high degree of precision by adjusting kind and concentration of dopant atoms implanted into the polysilicon layer 5. Furthermore, in the method of the third embodiment, since the shapes of the openings 62 and 63 formed in the polysilicon layer 5 can be adjusted by changing the concentration of dopant atoms, the diameters of the contact holes 64 and 65 can be changed by controlling the concentration of dopant atoms without changing etching conditions for forming the openings 60 and 61 of the resist layer 59 and an etching time. In the method of the third embodiment, contact resistance can be adjusted with a high degree of precision.

In the above-described first to third embodiments, polysilicon is used as a material, an etching rate of which changes in accordance with kind and concentration of the dopant atoms implanted therein. However, polysilicon can be replaced with other dielectric material, an etching rate of which changes in accordance with kind and concentration of the dopant atoms, such as silicon oxide, silicon nitride, SiOC, SiOCH$_3$, or SiOF.

Further, in the above-described first to third embodiments, the contact hole is formed on the interlayer insulating film 4 directly above a gate or an active area of a MOS type transistor. However, in the present invention, positions of the contact holes are not limited to the above-described positions.

Furthermore, in the above-described first to third embodiments, the interlayer insulating film 4 is composed of a single layer. However, the interlayer insulating film 4 may have a multilayer structure.

Figure 7:
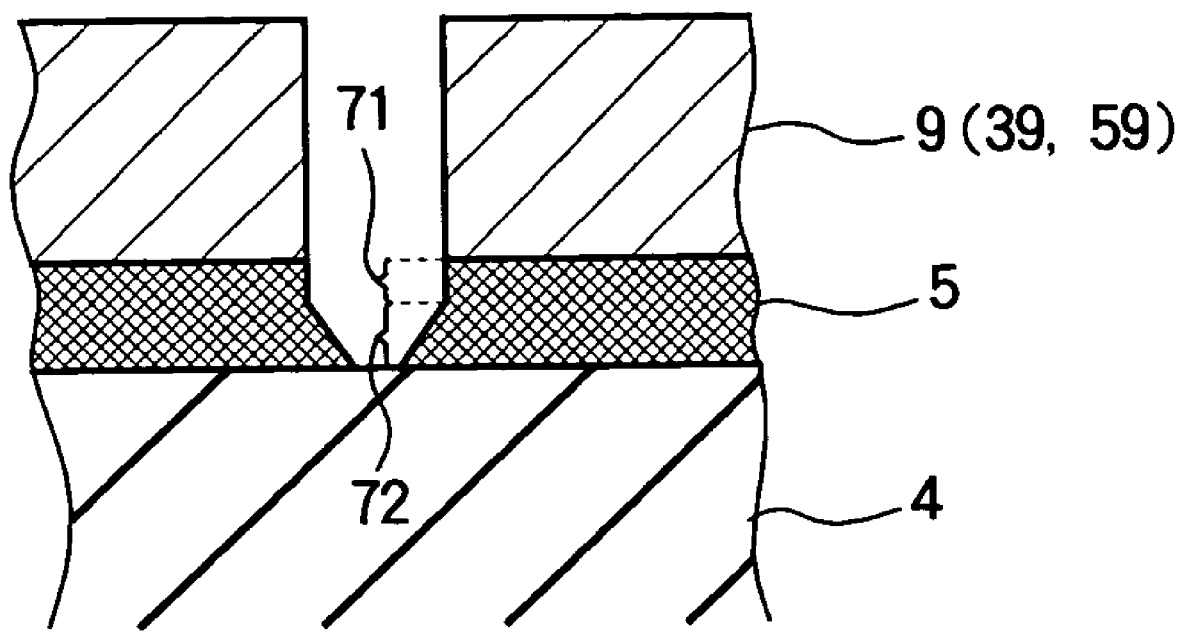
FIG. 7 is a cross sectional view schematically showing another example of an opening formed in the polysilicon layer.

Moreover, in the above-described first to third embodiments, as shown in FIG. 1D, FIG. 5E or FIG. 6D, the second openings 13, 43, 62 and 63 formed in the polysilicon layer 5 are illustrated a truncated cone having a small diameter on a side of the interlayer insulating film 4. However, when using the different etching process containing a main step and an overetching step, a pillar-shaped part 71 etched by the main step and a truncated cone part (or a tapered part) 72 etched by an overetching step are formed, as shown in FIG. 7.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of fabricating a semiconductor device comprising:
    forming a first layer on a semiconductor element;
    forming a second layer on said first layer, said second layer being made of a material having an etching rate which changes in accordance with kind and concentration of dopant atoms implanted therein;
    implanting dopant atoms into said second layer;
    forming a third layer on said second layer;
    forming one or more first openings in said third layer;
    etching said second layer using said third layer as a first mask, thereby forming one or more second openings in said second layer; and
    forming one or more contact holes in said first layer using at least said second layer as a second mask,
    wherein a plurality of said first openings are formed in said third aver as having a same diameter, during said forming one or more first openings,
    a plurality of said second openings are formed in said second layer as having different diameters, during said etching, and
    a plurality of said contact holes are formed in said first layer including at least one large-diameter contact hole and at least one small-diameter contact hole, during said forming one or more contact holes.

2. The method according to claim 1, wherein said first mask used during said forming one or more contact holes has a multilayer structure including said second layer and said third layer.

3. The method according to claim 1, further comprising:
    annealing said second layer after said implanting dopant atoms, thereby activating said dopant atoms.

4. The method according to claim 1, wherein said implanting dopant atoms is performed so that said dopant atoms are implanted into a whole area of said second layer.

5. The method according to claim 1, wherein said first layer is an interlayer insulating film.

6. The method according to claim 1, wherein said second layer is a polysilicon layer.

7. The method according to claim 1, wherein said second layer is a dielectric material.

8. The method according to claim 1, wherein said third layer is a resist layer.

9. The method according to claim 1, wherein said forming one or more first openings in said third layer is performed using photolithography.

10. The method according to claim 1, wherein said dopant atoms are either group V atoms or group III atoms.

11. The method according to claim 1, wherein said semiconductor element has a gate, a source and a drain;
    said at least one large-diameter contact hole is formed directly above said gate; and
    said at least one small-diameter contact hole is formed directly above at least one of said source and said drain.

12. A method of fabricating a semiconductor device comprising:
    forming a first layer on a semiconductor element;
    forming a second layer on said first layer, said second layer being made of a material having an etching rate which changes in accordance with kind and concentration of dopant atoms implanted therein;
    implanting dopant atoms into said second layer;
    forming a third layer on said second layer;
    forming one or more first openings in said third layer;
    etching said second layer using said third layer as a first mask, thereby forming one or more second openings in said second layer; and
    forming one or more contact holes in said first layer using at least said second layer as a second mask,
    wherein said implanting dopant atoms is performed so that said dopant atoms are implanted into said second layer inside a specific area and are not implanted into said second layer outside said specific area, and
    said forming one or more first openings is performed so that at least one of said first openings is formed in said third layer inside said specific area and others of said first openings are formed in said third layer outside said specific area.

13. A method of fabricating a semiconductor device comprising:
    forming a first layer on a semiconductor element;

forming a second layer on said first layer, said second layer being made of a material having an etching rate which changes in accordance with kind and concentration of dopant atoms implanted therein;

implanting dopant atoms into said second layer;

forming a third layer on said second layer;

forming one or more first openings in said third layer;

etching said second layer using said third layer as a first mask, thereby forming one or more second openings in said second layer; and forming one or more contact holes in said first layer using at least said second layer as a second mask, wherein said implanting dopant atoms is performed so that said dopant atoms include first dopant atoms and second dopant atoms different from said first dopant atoms, said first dopant atoms are implanted into said second layer inside a specific area, and said second dopant atoms are implanted into said second layer outside said specific area, and said forming one or more first openings is performed so that at least one of said first openings is formed in said third layer inside said specific area and others of said first openings are formed in said third layer outside said specific area.

14. The method according to claim 13, wherein said first dopant atoms are group V atoms and said second dopant atoms are group III atoms.

15. The method according to claim 13, wherein said first mask used during said forming one or more contact holes has a multilayer structure including said second layer and said third layer.

16. The method according to claim 13, further comprising:

annealing said second layer after said implanting dopant atoms, thereby activating said dopant atoms.

17. The method according to claim 13, wherein said first layer is an interlayer insulating film.

18. The method according to claim 13, wherein said second layer is a polysilicon layer.

19. The method according to claim 13, wherein said second layer is a dielectric material.

20. The method according to claim 13, wherein said third layer is a resist layer.

21. The method according to claim 13, wherein said forming one or more first openings in said third layer is performed using photolithography.

22. The method according to claim 13, wherein said dopant atoms are either group V atoms or group III atoms.

* * * * *